US012668041B2

(12) United States Patent
Woody, V et al.

(10) Patent No.: US 12,668,041 B2
(45) Date of Patent: *Jun. 30, 2026

(54) PROTECTIVE DISPLAY FILM WITH GLASS

(71) Applicant: 3M INNOVATIVE PROPERTIES COMPANY, St. Paul, MN (US)

(72) Inventors: Joseph W. Woody, V, Woodbury, MN (US); David Scott Thompson, Bayport, MN (US); Catherine A. Leatherdale, Woodbury, MN (US); Ryan M. Braun, St. Paul, MN (US); Michael A. Johnson, Stillwater, MN (US); Steven D. Solomonson, Shoreview, MN (US); John J. Stradinger, Roseville, MN (US); Lyudmila A. Pekurovsky, Bloomington, MN (US); Joseph D. Rule, Woodbury, MN (US); Peter D. Condo, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 511 days.

This patent is subject to a terminal disclaimer.

(21) Appl. No.: 18/152,807

(22) Filed: Jan. 11, 2023

(65) Prior Publication Data

US 2023/0158777 A1     May 25, 2023

Related U.S. Application Data

(63) Continuation of application No. 16/335,537, filed as application No. PCT/US2017/052770 on Sep. 21, 2017, now Pat. No. 11,577,492.

(Continued)

(51) Int. Cl.
    B32B 17/06        (2006.01)
    B32B 7/12         (2006.01)
    (Continued)

(52) U.S. Cl.
    CPC ................ *B32B 17/06* (2013.01); *B32B 7/12* (2013.01); *B32B 27/308* (2013.01); *B32B 27/40* (2013.01);
    (Continued)

(58) Field of Classification Search
    CPC ......... B32B 17/06; B32B 7/12; B32B 27/308; B32B 27/40; B32B 2307/56;
    (Continued)

(56)        References Cited

U.S. PATENT DOCUMENTS 3,391,053  A     7/1968   Kolb
3,574,030  A     4/1971   Callander et al.
                 (Continued)

FOREIGN PATENT DOCUMENTS

JP            04117463  A      4/1992
JP         2002180019  A      6/2002
                 (Continued)

OTHER PUBLICATIONS

"Silicone PSAs", ASI Adhesives & Sealants Industry, PSTC Week of Learning, 2006, URL: <http//www.pstc.org>, pp. 1-12.
                 (Continued)

*Primary Examiner* — Joe E. Schoenholtz
(74) *Attorney, Agent, or Firm* — Christoper P. Tebow

(57)        ABSTRACT

A display film includes a transparent glass layer having a thickness of 250 micrometers or less, or in a range from 25 to 100 micrometers. A transparent energy dissipation layer is fixed to the transparent glass layer. The transparent energy dissipation layer has a glass transition temperature of 27 degrees Celsius or less and a Tan Delta peak value of 0.5 or greater, or from 1 to 2.

19 Claims, 2 Drawing Sheets

Related U.S. Application Data

(60) Provisional application No. 62/397,584, filed on Sep. 21, 2016.

(51) Int. Cl.

| | |
|---|---|
| *B32B 27/30* | (2006.01) |
| *B32B 27/40* | (2006.01) |
| *H10K 59/80* | (2023.01) |
| *H10K 77/10* | (2023.01) |
| *H10K 102/00* | (2023.01) |

(52) U.S. Cl.

CPC ......... *H10K 59/873* (2023.02); *H10K 77/111* (2023.02); *B32B 2307/56* (2013.01); *B32B 2315/08* (2013.01); *B32B 2333/04* (2013.01); *B32B 2375/00* (2013.01); *B32B 2457/206* (2013.01); *H10K 2102/311* (2023.02)

(58) Field of Classification Search

CPC ............ B32B 2315/08; B32B 2333/04; B32B 2375/00; B32B 2457/206; B32B 2250/04; B32B 2255/26; B32B 2307/412; B32B 2307/732; B32B 2307/748; B32B 2457/20; B32B 2457/202; B32B 7/02; B32B 7/06; B32B 27/325; B32B 27/34; B32B 17/10; B32B 7/023; H10K 59/12; H10K 59/873; H10K 77/111; H10K 2102/311; H10K 50/844; Y02E 10/549; G06F 1/1613; G06F 1/1652

See application file for complete search history.

(56) References Cited

U.S. PATENT DOCUMENTS

| | | | |
|---|---|---|---|
| 6,376,590 | B2 | 4/2002 | Kolb et al. |
| 6,815,070 | B1 | 11/2004 | Bürkle et al. |
| 7,241,437 | B2 | 7/2007 | Davidson et al. |
| 7,980,910 | B2 | 7/2011 | Padiyath et al. |
| 10,005,264 | B2 | 6/2018 | Leatherdale et al. |
| 10,662,276 | B2 | 5/2020 | Colson et al. |
| 11,577,492 | B2 * | 2/2023 | Woody, V ................. B32B 7/02 |
| 11,631,829 | B2 * | 4/2023 | Eckert ..................... B32B 27/36 |
| | | | 257/40 |
| 2003/0111159 | A1 | 6/2003 | Hashimoto et al. |
| 2004/0052080 | A1 | 3/2004 | Hieda et al. |
| 2004/0266900 | A1 * | 12/2004 | Neff ................... C08G 18/4816 |
| | | | 521/155 |
| 2005/0038133 | A1 * | 2/2005 | Neff ..................... C08G 18/485 |
| | | | 521/155 |
| 2005/0084622 | A1 | 4/2005 | Houghtaling et al. |
| 2005/0147813 | A1 | 7/2005 | Gotz et al. |
| 2006/0148950 | A1 | 7/2006 | Davidson et al. |
| 2007/0092733 | A1 | 4/2007 | Yang et al. |
| 2008/0020170 | A1 | 1/2008 | Haubrich et al. |
| 2008/0220245 | A1 | 9/2008 | Suzuki et al. |
| 2008/0241524 | A1 | 10/2008 | Fukuda et al. |
| 2009/0004478 | A1 | 1/2009 | Baetzold et al. |
| 2009/0105437 | A1 | 4/2009 | Determan et al. |
| 2009/0280329 | A1 | 11/2009 | Rukavina et al. |
| 2011/0045306 | A1 | 2/2011 | Johnson et al. |
| 2012/0229893 | A1 | 9/2012 | Hebrink et al. |
| 2013/0335823 | A1 | 12/2013 | Epstein et al. |
| 2014/0370307 | A1 | 12/2014 | Hao et al. |
| 2015/0266272 | A1 | 9/2015 | Lee et al. |
| 2015/0325814 | A1 | 11/2015 | Yang et al. |
| 2015/0330597 | A2 | 11/2015 | Schaffer et al. |
| 2016/0002103 | A1 | 1/2016 | Wang et al. |
| 2016/0168432 | A1 | 6/2016 | You et al. |
| 2016/0185926 | A1 | 6/2016 | Song et al. |
| 2016/0312363 | A1 | 10/2016 | Yamashita et al. |
| 2016/0376025 | A1 * | 12/2016 | Bimanand ................ C08J 7/043 |
| | | | 428/334 |
| 2017/0100920 | A1 | 4/2017 | Matsumori et al. |
| 2018/0051123 | A1 * | 2/2018 | Rukavina ............. C08G 18/792 |
| 2018/0053451 | A1 * | 2/2018 | Han ..................... H10K 50/844 |
| 2018/0315953 | A1 | 11/2018 | Hu et al. |
| 2019/0140214 | A1 | 5/2019 | Kim et al. |
| 2020/0309999 | A1 | 10/2020 | Thompson et al. |
| 2021/0139748 | A1 * | 5/2021 | Behling ............ C08F 220/1804 |
| 2023/0120549 | A1 * | 4/2023 | Rukavina ............... C08G 18/08 |
| | | | 528/59 |

FOREIGN PATENT DOCUMENTS

| | | |
|---|---|---|
| JP | 2005239977 A | 9/2005 |
| JP | 2005288787 A | 10/2005 |
| JP | 2010107956 A | 5/2010 |
| JP | 2016060833 A | 4/2016 |
| KR | 20100023355 A | 3/2010 |
| WO | 2003094256 A2 | 11/2003 |
| WO | 2009120548 A2 | 10/2009 |
| WO | 2009148722 A2 | 12/2009 |
| WO | 2011056396 A2 | 5/2011 |
| WO | 2012138675 A1 | 10/2012 |
| WO | 2014035942 A1 | 3/2014 |
| WO | 2014092422 A1 | 6/2014 |
| WO | 2014133925 A1 | 9/2014 |
| WO | 2014152819 A1 | 9/2014 |
| WO | 2014197194 A1 | 12/2014 |
| WO | 2014197368 A1 | 12/2014 |
| WO | 2015188029 A1 | 12/2015 |
| WO | 2015191949 A1 | 12/2015 |
| WO | 2016028542 A1 | 2/2016 |
| WO | 2016106207 A1 | 6/2016 |
| WO | 2017105850 A1 | 6/2017 |
| WO | 2017214105 A2 | 12/2017 |
| WO | 2018005833 A2 | 1/2018 |

OTHER PUBLICATIONS

Charlesby, "Elastic Modulus Formulae For A Crosslinked Network", International Journal of Radiation Applications And Instrumentation. Part C. Radiation Physics And Chemistry, 1992, vol. 40, No. 02, pp. 117-120.

DMA Q800 Specifications, TA Instruments, 2010, pp. 75-96.

International Search report for PCT International Application No. PCT/US2017/052770, mailed on Jan. 9, 2018, 6 pages.

Pongmuksuwan, "Synthesis and characterization of soft polyurethane for pressure ulcer prevention", Polymer Testing, 2022, vol. 112, No. 107634, pp. 1-11.

* cited by examiner

PROTECTIVE DISPLAY FILM WITH GLASS

BACKGROUND

Displays and electronic devices have evolved to be curved, bent, or folded and provide new user experiences. These device architectures may include flexible organic light emitting diodes (OLEDs), plastic liquid crystal displays (LCDs) and the like, for example.

Flexible and foldable display architectures represent a new paradigm for displays and provide for significant expansion of design freedom and new form factors that may provide significant new value to consumers. One challenge is the outer protective layer on the display device, sometime referred to as cover glass, cover window films, or cover window sheets. Recent mobile displays have focused on the use of chemically strengthened glass sold under trade names like Gorilla Glass and Dragon Glass. In use these cover glasses tend to have thicknesses in the range of at least 400-500 um in total thickness and provide a gloss surface to the displays and with proper coatings have low coefficient of friction and anti-reflective surfaces. One challenge with these cover glasses is that the emergence of flexible and foldable displays places a requirement on the cover glass surface in that it may be flexed or bent and in the case of folding may need to fold with bend radii of <10 mm or <5 mm or <3 mm or even 1 mm. A variety of hard coated plastic substrates have been explored. More exotic materials like hard coated colorless transparent polyimide films have been shown to have high hardness and good scratch resistance. However many hard coated films fail to withstand folding events around a tight bend radius or impact events without showing visible damage.

SUMMARY

The present disclosure relates to display film with glass that protects a display window and may survive flexing, folding or impact tests. The protective display film maintains optical properties of a display film while providing scratch resistance to the display. The display film includes a transparent energy dissipation layer disposed on a glass layer.

In one aspect, a display film includes a transparent glass layer with a thickness of 250 micrometers or less, or in a range from 25 to 100 micrometers. A transparent energy dissipation layer is fixed to the transparent glass layer. The transparent energy dissipation layer has a glass transition temperature of 27 degrees Celsius or less and a Tan Delta peak value of 0.5 or greater, or from 1 to 2, and a Young's Modulus (E') greater than 0.9 MPa over the temperature range of −40 degrees Celsius to 70 degrees Celsius.

In another aspect, a display film includes a transparent glass layer with a thickness of 250 micrometers or less, or in a range from 25 to 100 micrometers. A transparent energy dissipation layer is fixed to the transparent glass layer. The transparent energy dissipation layer has a glass transition temperature of 27 degrees Celsius or less and a Tan Delta peak value of 0.5 or greater, or from 1 to 2, and a Young's Modulus (E') greater than 0.9 MPa over the temperature range of −40 degrees Celsius to 70 degrees Celsius. A protective layer is fixed to the transparent glass layer. The transparent glass layer separates the transparent energy dissipation layer from the protective layer.

In another aspect, a display film includes a transparent glass layer with a thickness of 250 micrometers or less, or in a range from 25 to 100 micrometers. A transparent energy dissipation layer is fixed to the transparent glass layer. The transparent energy dissipation layer has a glass transition temperature of 27 degrees Celsius or less and a Tan Delta peak value of 0.5 or greater, or from 1 to 2, and a Young's Modulus (E') greater than 0.9 MPa over the temperature range of −40 degrees Celsius to 70 degrees Celsius. An optically clear adhesive layer is disposed on the transparent glass layer. A protective layer is disposed on the optically clear adhesive layer. The optically clear adhesive layer separates the transparent energy dissipation layer from the protective layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figures 1, 2, 3, 4, 5, 6:
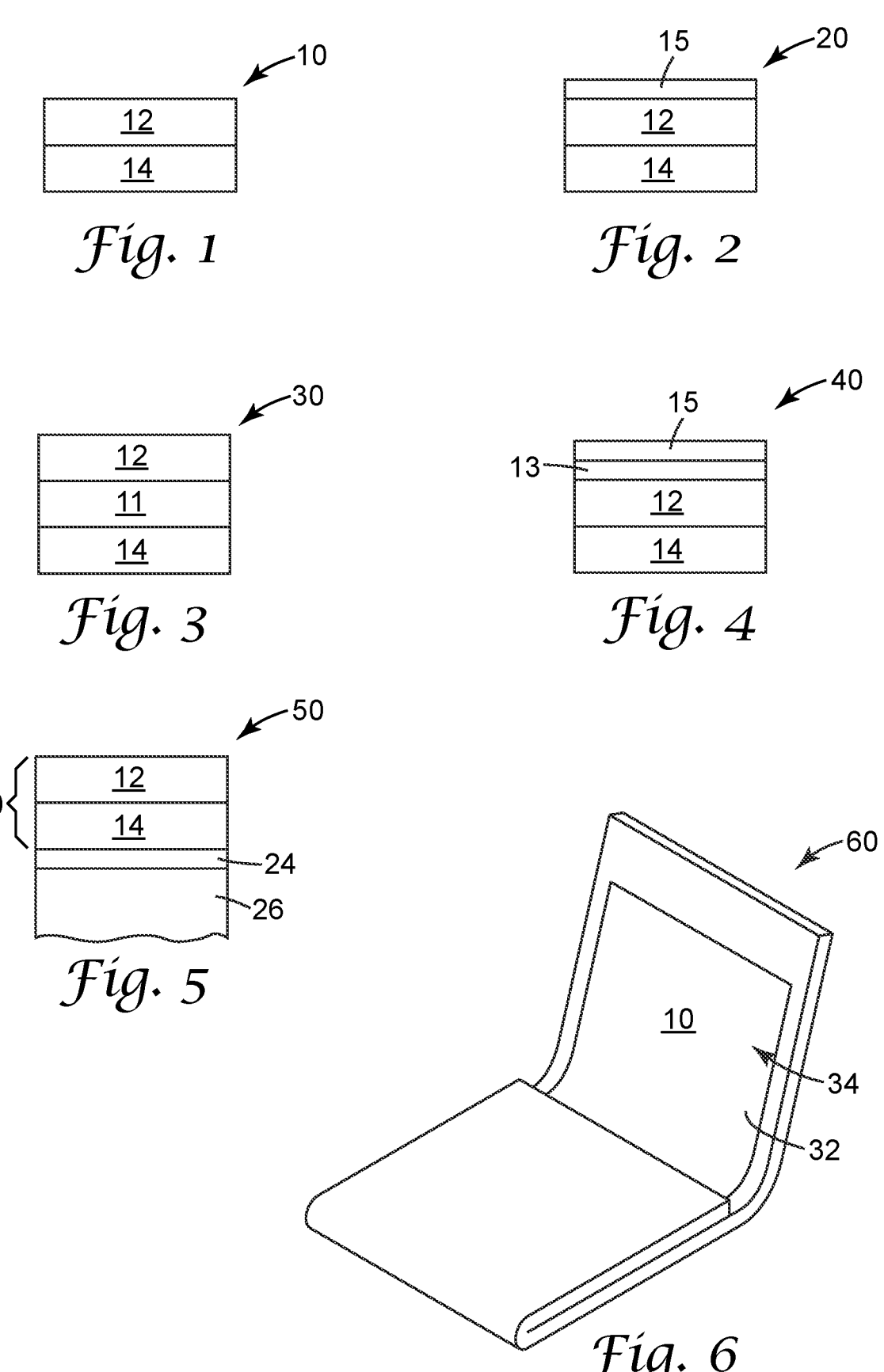
FIG. 1 is a schematic diagram side elevation view of an illustrative display film.
FIG. 2 is a schematic diagram side elevation view of another illustrative display film.
FIG. 3 is a schematic diagram side elevation view of another illustrative display film.
FIG. 4 is a schematic diagram side elevation view of another illustrative display film.
FIG. 5 is a schematic diagram side elevation view of an illustrative display film on an optical display forming an article.
FIG. 6 is a schematic diagram perspective view of an illustrative folding article including an illustrative display film.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

The terms "display film", "protective film", "cover sheet film", and "protective display film" are herein used interchangeably.

"Transparent substrate" or "transparent layer" refers to a substrate or layer that has a high light transmission (typically greater than 90%) over at least a portion of the surface of the substrate over at least a portion of the light spectrum with wavelengths of about 350 to about 1600 nanometers, including the visible light spectrum (wavelengths of about 380 to about 750 nanometers).

"Polyurethane" refers to polymers prepared by the step-growth polymerization of hydroxyl-functional materials (materials containing hydroxyl groups —OH) with isocyanate-functional materials (materials containing isocyanate groups —NCO) and therefore contain urethane linkages (—O(CO)—NH—), where (CO) refers to a carbonyl group (C=O). The term may include "polyurethane-ureas" in which both urethane linkages and urea linkages are present.

"Polyurethane acrylate" refers to a polymer that includes primarily urethane and acrylate moieties or segments.

The phrase "glass transition temperature" refers herein to the "on-set" glass transition temperature by DSC and is measured according to ASTM E1256-08 2014.

The phrase "Tan Delta peak value" and peak temperature is measured according to the DMA analysis described in the Examples.

The term "protective layer" may also be referred to as an abrasion resistant layer.

The present disclosure relates to display film with glass that protects a display or display window and may survive flexing, folding or impact tests. The protective display film maintains optical properties of a display film while providing durability to the display.

These constructions enable curved, bendable, and dynamically reconfigurable displays that are both optically clear and meet the rigorous surface abrasion and impact resistance demands while maintaining the display form factor. The protective display film generally includes an energy dissipation layer fixed to a thin glass layer. This protective display film enables displays to survive impact events and recover from bending. The protective display film includes an energy dissipation layer fixed to a thin glass layer. The thin glass layer may be less than 500 micrometers, or less than 300 micrometers, or less than 200 micrometers, or less than 100 micrometers or less than 50 micrometers. The energy dissipation layer may be a cross-linked polymer such as a cross-linked polyurethane material or a cross-linked polyurethane acrylate material. The energy dissipation layer is transparent and may have a glass transition temperature of less than 27 degrees Celsius, or less than 10 degrees Celsius, or less than 5 degrees Celsius. The protective display film may protect flexible optical displays even under conditions of dynamic folding. The energy dissipation layer may have a low glass transition temperature, such as 5 degrees Celsius or less, or zero degrees Celsius or less, or -5 degrees Celsius or less, or -10 degrees Celsius or less or in a range from -40 to 5 degrees Celsius, or in a range from -30 to 5 degrees Celsius, or in a range from -20 to 5 degrees Celsius, or in a range from -15 to 5 degrees Celsius. The energy dissipation layer has a Tan Delta peak value of 0.5 or greater, or 0.8 or greater, or 1.0 or greater, or 1.2 or greater. The energy dissipation layer or layers have a Young's Modulus (E') greater than 0.9 MPa over the temperature range of -40 degrees Celsius to 70 degrees Celsius. The protective display film can include a layered structure including a protective layer. Optional border elements may be created by die-cut (or otherwise converted) decorative film inserted between any layer(s) in the display film construction. While the present disclosure is not so limited, an appreciation of various aspects of the disclosure will be gained through a discussion of the examples provided below.

FIG. 1 is a schematic diagram side elevation view of an illustrative display film 10. The terms "display film", "cover film", "protective film", "protective cover film" or "protective display film" are used interchangeable herein. The display film 10 includes a transparent glass layer 12 and a transparent energy dissipation layer 14 disposed on the glass layer 12. The transparent energy dissipation layer 14 may be directly fixed or coupled to the glass layer 12. The transparent energy dissipation layer 14 has a glass transition temperature of 27 degrees Celsius or less and a Tan Delta peak value of 0.5 or greater, or from 1 to 2.

The transparent energy dissipation layer may not be a pressure sensitive adhesive or function as a pressure sensitive adhesive. For example, the transparent energy dissipation layer has a Young's Modulus larger than 0.9 MPa over the temperature range -40 degrees Celsius to 70 degrees Celsius.

FIG. 2 is a schematic diagram side elevation view of an illustrative display film 20 that includes a protective layer 15. The protective layer 15 is disposed on the transparent glass layer 12, and the transparent glass layer 12 separates the transparent energy dissipation layer 14 from the protective layer 15. The protective layer 15 may be directly fixed or coupled to the glass layer 12.

The protective layer 15 may be directly fixed to the transparent glass layer 12. For example the protective layer 15 may be coated directly onto the transparent glass layer 12. The protective layer 15 may encompass one or more of edges of the transparent glass layer 12. The protective layer 15 may be directly fixed to a transparent substrate and the transparent substrate may be directly fixed to the transparent glass layer 12.

FIG. 3 is a schematic diagram side elevation view of an illustrative display film 30 that includes an intermediate adhesive layer 11 fixing the energy dissipation layer 14 to the glass layer 12.

FIG. 4 is a schematic diagram side elevation view of an illustrative display film 40 that includes an optically clear adhesive layer 13 fixing the protective layer 15 to the glass layer 12. The protective layer 15 may encompass one or more of edges of the transparent glass layer 12. The protective layer 15 may be directly fixed to a transparent substrate and the transparent substrate may be directly fixed to the transparent glass layer 12. Alternatively, the protective layer 15 may be coated directly onto the optically clear adhesive layer 13.

A further display film embodiment includes an energy dissipation layer separating two release liners. A further display film embodiment includes an energy dissipation layer separating a release liner from an adhesive layer, and a second release liner is disposed on the adhesive layer. The adhesive layer may be an optical clear adhesive layer, as described herein or a pressure sensitive adhesive layer, or any adhesive or coupling layer described herein.

The illustrative display film constructions may include an ink border that defines a viewing window. The ink border may be a continuous frame element printed, for example, onto the transparent glass layer or the energy dissipation layer, for example.

The display film may include one or more additional layers. Additional layers may include conductive layers for touch sensitive display elements or barrier layers. One or more additional transparent polymeric substrate layers may be disposed in the display film of any useful polymeric material that provides desired mechanical properties (such as dimensional stability) and optical properties (such as light transmission and clarity) to the display film. Examples of materials suitable for use in the polymeric substrate layer include polymethylmethacrylate, polycarbonate, polyamides, polyimide, polyesters (PET, PEN), polycyclic olefin polymers, and thermoplastic polyurethanes.

The optional one or more barrier layers may include a transparent barrier layer. The transparent barrier layer may be disposed on the glass layer or the protective layer or the energy dissipation layer. The transparent barrier layer can mitigate or slow ingress of oxygen or water through the display film. Transparent barrier layers may include for example, thin alternating layers of silica, alumina or zirconia together with an organic resin. Exemplary transparent barrier layer are described in U.S. Pat. No. 7,980,910 and WO2003/094256.

Optional additional layers may include a microstructure layer, an anti-glare layer, anti-reflective layer, or an anti-fingerprint layer. Additional optional layers may be disposed in the interior of the display film. One useful additional layer disposed within the display film is a sparkle reduction layer as described in WO2015/191949. The sparkle reduction layer may be particularly useful with high definition displays that include anti-glare coatings.

The overall thickness of the display film described herein may have any useful value depending on the application. The thickness of the display film is a balance between being thick enough to provide the desired display protection and thin enough to provide the level of flexibility desired for the device application and reduced thickness to meet desired design parameters. In some cases the level of flexibility desired is a display film having a bend radii of 5 mm or less, or 4 mm or less, or 3 mm or less or in a range from 1 to 5 mm. The overall thickness of the display film may be in a range from 30 to 300 micrometers, or from 40 to 200 micrometers, or from 40 to 150 micrometers. When the display film folds upon itself, it may have a total thickness in a range from 30 to 200 micrometers or from 40 to 150 micrometers. When the display film moderately flexes, it may have total thickness in a range from 300 to 500 micrometers. When the display film is curved but does not appreciably flex, it may have total thickness in a range from 500 to 1000 micrometers.

The display films described herein may have a haze value of 2% or less, or 1.5% or less, or 1% or less, or 0.5% or less. In some embodiments the display film may have a haze value of 5% or less. The display film may have a clarity of 98% or greater, or 99% or greater. The display film may have a visible light transmission of 85% or greater, or 90% or greater, or 93% or greater.

The display film may have a yellow index or b* value of 5 or less, or 4 or less, or 3 or less, or 2 or less, or 1 or less. In many embodiments the display film may have a yellow index or b* value of 1 or less.

The transparent glass layer 12 may be formed of any useful glass material. The transparent glass layer 12 may be treated to provide beneficial properties. For example, the transparent glass layer 12 may be ion implanted, chemically strengthened or tempered, and the like. The transparent glass layer 12 may have a thickness that is appropriate for a given bend radius or radius of curvature. The transparent glass layer 12 may have a thickness of 500 micrometers or less, or from 300 micrometers or less or from 10 to 200 micrometers, or from 25 to 100 micrometers or from 25 to 50 micrometers. Suppliers of thin transparent glass include Corning, Nippon Electric Glass, Schott and Asahi Glass.

The energy dissipation layer 14 may have a glass transition temperature of 27 degrees Celsius or less, or less than 10 degrees Celsius, or less than 5 degrees Celsius. The energy dissipation layer may have a low glass transition temperature, such as 5 degrees Celsius less, or zero degrees Celsius or less, or −5 degrees Celsius or less, or −10 degrees Celsius or less or in a range from −40 to 5 degrees Celsius, or in a range from −30 to 5 degrees Celsius, or in a range from −20 to 5 degrees Celsius, or in a range from −15 to 5 degrees Celsius, or in a range from −10 to 5 degrees Celsius, or in a range from −5 to 5 degrees Celsius. Glass transition temperature is herein characterized using Dynamic Mechanical Analysis using E".

The energy dissipation layer may have a Tan Delta peak value of 0.5 or greater, or 0.8 or greater, or 1.0 or greater, or 1.2 or greater, or from 0.5 to 2.5, or from 1 to 2.5, or from 1 to 2. The energy dissipation layer or layers have a Young's Modulus (E') greater than 0.9 MPa over the temperature range −40 degrees Celsius to 70 degrees Celsius. The energy dissipation layer would not be referred to as a pressure sensitive adhesive.

The energy dissipation layer may be formed of a plurality of layers, and at least two of these layers having a different glass transition temperature value. These layers may have a different glass transition temperature value by at least 2 degrees Celsius, or at least 5 degrees Celsius, or at least 10 degrees Celsius, for example In some cases, each energy dissipation layer peak Tan Delta values may occur at different frequencies at a specified temperature.

The energy dissipation layer may have a thickness of at least 20 micrometers or at least 30 micrometers or at least 50 micrometers. The energy dissipation layer may have a thickness in a range from 20 to 200 micrometers, or 50 to 150 micrometers, or from 75 to 150 micrometers. The thickness of the energy dissipation layer may be a balance between being thick enough to provide the desired protection to the display and thin enough to provide the dynamic performance requirements and/or reduced thickness for industrial design considerations.

The energy dissipation layer may be a cross-linked polymer layer formed of a cross-linked polyurethane material or a cross-linked polyurethane acrylate material. The energy dissipation layer may be designed to have beneficial properties with respect to impact resistance and the ability to survive dynamic folding at low temperature conditions, for example.

A transparent cross-linked polyurethane layer preferably includes chemically or covalently crosslinked materials derived from step growth polymerization of isocyanate and polyol oligomers. Selection of reactant isocyanates and polyols may modify the glass transition temperature of the resulting cured polyurethane.

The cross-linked polyurethane layer may be coated onto the transparent polymeric or glass substrate layer (that may be primed) and then be cured or cross-linked to form a thermoset polyurethane layer. Alternatively, the cross-linked polyurethane layer could be produced as a film that is then laminated to the transparent glass layer in a subsequent process step. Such lamination could be assisted with heat, vacuum, or through the use of an adhesive or combination thereof.

Polyurethane is a polymer composed of organic units joined by carbamate (urethane) links The polyurethanes described herein are thermosetting polymers that do not melt when heated. Polyurethane polymers may be formed by reacting a di- or polyisocyanate with a polyol. Both the isocyanates and polyols used to make polyurethanes contain on average two or more functional groups per molecule. The polyurethanes described herein may be derived from components that have functionality greater than 2.4 or 2.5.

For the purposes of processing, the isocyanate and polyol components can be mixed just prior to application of the material to the substrate used for making the display film. Generally the average functionality of the isocyantes used to make the energy dissipation layer is less than 3.5 (i.e. an average of 3.5 isocyanate functional groups per molecule) or 3 or less. The ideal cured material exhibits stable material properties with respect to the display film use in application, i.e. the energy dissipation layer does not exhibit appreciable flow but is stable enough to provide durability in physical testing in folding devices, for example low temperature dynamic folding performance.

In some cases, the energy dissipation layer may also contain inorganic nanoparticles, either functional that are chemically reacted to the matrix or non-functional that are not reacted to the energy dissipation layer matrix resin. The incorporation of nanoparticles may provide beneficial properties related to impact resistance and energy dissipation from impact events.

A wide variety of polyisocyanates may be used to from the cross-linked polyurethane layer. The term polyisocyanate includes isocyanate-functional materials that generally include at least 2 terminal isocyanate groups. Polyisocyanates include diisocyanates (materials with 2 terminal isocyanate groups) and higher polyisocyanates such as triisocyanates (materials with 3 terminal isocyanate groups), tetraisocyanates (materials with 4 terminal isocyanate groups), and the like. Typically the reaction mixture contains at least one higher isocyanate if a difunctional polyol is used. Higher isocyanates are particularly useful for forming cross-linked polyurethane polymers. Diisocyanates may be generally described by the structure OCN—Z—NCO, where the Z group may be an aliphatic group, an aromatic group, or a group containing a combination of aromatic and aliphatic groups. In some embodiments, it is preferable to use an aliphatic isocyanate, such as isophorone diisocyanate (IPDI), dicyclohexylmethane-4,4'-diisocyanate (H12MDI), dimeryl diisocyanate (DDI), pentamethylenediisocyanate (PDI), hexamethylenedisocyanate (HDI), and oligomers, derivatives, or combinations of these isocyanates. It may be preferable to include the use of alkyl and aromatic monoisocyanates, such as phenyl isocyanate and octyl isocyanate.

Higher functional polyisocyanates are particularly useful, such as triisocyanates, to form a crosslinked polyurethane polymer layer. Triisocyanates include, but are not limited to, polyfunctional isocyanates, such as those produced from isocyanurates, biurets, allophanates, uretdiones, iminooxadiazinediones, carbodiimides, uretoneimines adducts, and the like. Some commercially available polyisocyanates include portions of the DESMODUR and MONDUR series from Bayer Corporation, Pittsburgh, Pa., and the PAPI series from Dow Plastics, a business group of the Dow Chemical Company, Midland, Mich.

In some embodiments, isocyanates based on HDI are preferred to provide a glass transition temperature below 10° C. Monomeric HDI can be used, but in some embodiments, it is preferred to use oligomers of HDI. Oligomeric HDI can reduce the vapor pressure of the isocyanate to allow safer handling and may provide functionalities greater than 2.0 to provide chemical crosslinking of the energy dissipation layer material. The HDI oligomers can contain functional groups including isocyanurates, biurets, allophanates, uretdiones, iminooxadiazinediones, carbodiimides, or uretoneimines In some embodiments, prepolymers derived from HDI and polyols can be used. In some embodiments, it is preferred to use HDI oligomers containing uretdione functionality and isocyanurate functionality. Particularly useful higher isocyanates include those available from Bayer Corporation under the trade designations DESMODUR N3300A, Desmodur N3400, and MONDUR 489. An oligomer containing both uretdione and isocyanurate groups can be obtained under the trade name DESMODUR N3400, and an oligomer containing isocyanurate groups can be obtained under the tradename DESMODUR N3300. One particularly suitable aliphatic polyisocyanate is DESMODUR N3300A.

A wide variety of polyols may be used to form the cross-linked polyurethane layer. The term polyol includes hydroxyl-functional materials that generally include at least 2 terminal hydroxyl groups. Polyols include diols (materials with 2 terminal hydroxyl groups) and higher polyols such as triols (materials with 3 terminal hydroxyl groups), tetraols (materials with 4 terminal hydroxyl groups), and the like. Typically the reaction mixture contains at least some diol and may also contain higher polyols. Higher polyols are particularly useful for forming crosslinked polyurethane polymers. Diols may be generally described by the structure HO—B—OH, where the B group may be an aliphatic group, an aromatic group, or a group containing a combination of aromatic and aliphatic groups, and may contain a variety of linkages or functional groups, including additional terminal hydroxyl groups.

In some embodiments, the polyol is an oligomeric polyether such as polyethylene glycol, polypropylene glycol, or polytetramethylene ether glycol. In some embodiments, aliphatic polyester polyols are particularly useful. Useful polyester polyols are linear and non-linear polyester polyols including, for example, polyethylene adipate, polypropylene adipate, polybutylene adipate, polyhexamethylene adipate, polyneopentyl adipate, polycyclohexanedimethyl adipate, polydiethylene glycol adipate, polybutylene succinate, polyhexamethylene sebacate, polyhexamethylene dodecanedioate, and poly E-caprolactone and copolymers of these polyesters. Particularly useful are aliphatic polyester polyols available from King Industries, Norwalk, Conn., under the trade name "K-FLEX" such as K-FLEX 188 or K-FLEX A308. In some embodiments, the polyester polyol can include polyesters derived from cyclohexanedimethanol and aliphatic diacids. In some embodiments, it is preferred to use polyester polyols that are liquids at room temperature to facilitate mixing and coating at ambient temperature. In some embodiments, it is preferred to use polyester polyols that produce a sharp tan delta signal in DMA testing, such as polyesters based on cyclohexanedimethanol and neopentyl glycol.

The energy dissipation layer may be derived from an oligomeric polyol. In some embodiments, the polyol component may include a chain extender with a molecular weight of less than 200 g/mol. In some embodiments, the polyol component comprises only oligomeric polyol and is substantially free of chain extenders.

To produce an energy dissipation layer with a glass transition temperature below 10° C., it can be preferable to limit the amount of the isocyanate component. In some embodiments using HDI-derived isocyanates, it can be preferable to use less than 40 wt % isocyanate component based on the total core layer composition, or less than 38 wt %, or less than 35 wt %. In some embodiments, it is preferable to use an isocyanate component containing uretdione groups. When uretdione groups are included, it can be preferable to use an excess of hydroxyl functional groups relative to isocyanate groups. The excess hydroxyl groups can react with the uretdione groups to form allophanate groups to provide cure and chemical crosslinking In some embodiments, it is preferable to include only a single polyol component to produce a narrow tan delta peak. In some embodiments, it is preferable to use a polyol component and an isocyanate component that are miscible with each other at room temperature.

The cross-linked polyurethane layer is preferably prepared such that the combined average functionality of the polyol component and the isocyanate component is greater than 2.4 or 2.5. In some cases, both the polyol and isocyanate each have an average functionality greater than 2.4 or 2.5. In some cases, only the isocyanate has an average functionality greater than 2.4 or 2.5, and the polyol component has an average functionality of about 2.0. In some cases, only the polyol has an average functionality greater than 2.4 or 2.5, and the isocyanate component has an average functionality of about 2.0.

The isocyanate index is defined as the molar content of isocyanate functional groups divided by the hydroxyl functional groups. The crosslinked polyurethane is preferably prepared with an isocyanate index between 0.6 and 1.2 or between 0.7 and 1.1 or between 0.75 and 1.05.

In some cases, the isocyanate component can contain uretdione functionality. Under appropriate conditions, excess hydroxyl groups can react with the uretdione functional groups for form an allophanate group that further enhances crosslinking When uretdione functional groups are present, an alternative index can be calculated by dividing the sum of the moles of isocyanate functional groups and uretdione functional groups by the moles hydroxyl functional groups. In some embodiments, it is preferable that this alternative index be between 0.8 and 1.2 or between 0.85 and 1.1 or between 0.90 and 1.0.

The degree of crosslinking of the polyurethane energy dissipation layer can be related to the amount of gel content in the urethane. The gel content can be measured by submerging a sample of urethane in a solvent, such as refluxing THF, to extract the non-gel component. The gel content can then be measured gravimetrically by dividing the remaining dried weight after extraction by the weight of sample before extraction. In some embodiments, the core layer can have a gel content of greater than 80%, or greater than 90%, or greater than 95%.

The reactive mixture used to form the cross-linked polyurethane layer also contains a catalyst. The catalyst facilitates the step-growth reaction between the polyol and the polyisocyanate. Conventional catalysts generally recognized for use in the polymerization of urethanes may be suitable for use with the present disclosure. For example, aluminum-based, bismuth-based, tin-based, vanadium-based, zinc-based, or zirconium-based catalysts may be used. Tin-based catalysts are particularly useful. Tin-based catalysts have been found to significantly reduce the amount of outgassing present in the polyurethane. Most desirable are dibutyltin compounds, such as dibutyltin diacetate, dibutyltin dilaurate, dibutyltin diacetylacetonate, dibutyltin dimercaptide, dibutyltin dioctoate, dibutyltin dimaleate, dibutyltin acetonylacetonate, and dibutyltin oxide. In particular, the dibutyltin dilaurate catalyst DABCO T-12, commercially available from Air Products and Chemicals, Inc., Allentown, Pa. is particularly suitable. The catalyst is generally included at levels of at least 200 ppm or even 300 ppm or greater.

In some embodiments, it is desirable for the glass transition temperature of the cross-linked polyurethane layer (or core layer) be 10 degrees Celsius or less, or 5 degrees Celsius or less, or 0 degrees Celsius or less, or −5 degrees Celsius or less, or −10 degrees Celsius or less, or in a range from −40 to 5 degrees Celsius, or in a range from −30 to 5 degrees Celsius, or in a range from −20 to 5 degrees Celsius, or in a range from −15 to 5 degrees Celsius. In some cases, it is also desirable that the crosslinked material have a high Tan Delta (>0.5, >0.8, >1.0 or greater than 1.2).

The transparent cross-linked polyurethane layer may have a cross-link density in a range from 0.1 to 1.0 mol/kg or from 0.2 to 0.9 mol/kg or from 0.37 to 0.74 mol/kg. The crosslink density of the cured polyurethane coatings is calculated using the method described in *Macromolecules, Vol.* 9, No. 2, pages 206-211 (1976). To implement this model, integral values for chemical functionality are required. DESMO-DUR N3300 is reported to have an average functionality of 3.5 and an isocyanate equivalent weight of 193 g/equiv. This material was represented in the mathematical model as a mixture of 47.5 wt % HDI trimer (168.2 g/equiv.), 25.0 wt % HDI tetramer (210.2 g/equiv.), and 27.5 wt % of HDI pentamer (235.5 g/equiv.). This mixture yields an average equivalent weight of 193 g/equiv. and an average functionality of 3.5. Desmodur N3400 is reported to have an average functionality 2.5 and an equivalent weight of 193, and it is reported to be blend of the HDI isocyanurate trimer and HDI uretdione dimer. This material was represented in the mathematical model as a mixture of 19 wt % HDI isocyanurate trimer, 33 wt % HDI uretdione dimer, and 10 wt % of HDI uretdione trimer and 38 wt % of HDI tetramer having one isocyanurate group and one uretdione group. In the mathematical model, the functionality was determined by the sum the isocyanate groups and the uretdione groups in the cases where there was an excess of hydroxyl groups relative to the sum of the isocyanate and uretdione groups.

A cross-linked polyurethane containing energy dissipation layer or layers may be formed by free radical polymerization of multifunctional urethane acrylate oligomers. The urethane acrylate oligomer may be mixed with other low molecular weight monofunctional and/or multifunctional acrylates to modify the pre-cured viscosity of the resin for the purposes of processing. Generally the average functionality of the multifunctional acrylate used in the energy dissipation layer prior to cure is less than 3 (i.e. 3 functional acrylate functional groups per molecule) or can be 2 or less. The cured (or crosslinked) material may exhibit stable material properties with respect to the display film use in application, that is, the energy dissipation layer may not exhibit appreciable flow.

The transparent polyurethane acrylate material may be coated onto the transparent polymeric or glass substrate layer (that may be primed) and then be cured or cross-linked to form a thermoset or cross-linked polyurethane acrylate layer. The polyurethane acrylates described herein are thermosetting polymers that may not melt when heated.

Urethane acrylate oligomers can be comprised of a wide variety of urethane materials with acrylate or methacrylate reactive groups. Urethane acrylate oligomers are commercially available from vendors such as, for example, Sartomer of Exton, Pa. (a subsidiary of Arkema) and Allnex (Ebecryl Brand name).

Examples of commercially available aliphatic urethane oligomers include but are not limited to CN9002, CN9004 and CN3211 available from Sartomer Company and those sold under the Ebecryl brand name.

The display film may include a protective layer. The protective layer provides abrasion resistance to the display film and may also be referred to as an abrasion resistant layer. A protective layer or abrasion resistant layer includes a hardcoat layer, a nanoparticle nanocomposite ionic elastomeric layer, or an elastic nanocomposite urethane layer.

Abrasion is a method of wearing down or rubbing away material by means of friction. The abrasion resistance of a material helps it to withstand mechanical action and tends to protect the removal of materials from its surface. This allows the material to retain its integrity and hold its form. Abrasion resistance can be measured by rubbing or wiping the transparent protective layer for a specified number of cycles with a rough material such as steel wool or a scouring pad and then inspecting the layer for visible changes such as fine scratches or haze.

An abrasion resistant layer may include a hardcoat layer disposed directly on a display film layer (for example on glass) or the hardcoat layer may be disposed on a substrate layer and this composite layer is disposed on a display film layer. The hardcoat layer may have a thickness of less than 50 micrometers, or less than 40 micrometers, or a thickness in a range from 2 to 30 micrometers, or from 2 to 15 micrometers, or from 3 to 10 micrometers. The substrate layer may have a thickness greater than 10 micrometers or less than 200 micrometers. The substrate layer preferably is a transparent polymer layer.

The substrate layer (that forms a portion of the protective layer) may have a thickness in a range from 10 to 125 micrometers, or from 25 to 100 micrometers, or from 30 to 85 micrometers. The substrate layer may have a yield stress value greater than 70 MPa, or greater than 90 MPa, or greater than 120 MPa, or greater than 160 MPa. The phrase "yield stress" or "offset yield stress" refers herein to "0.2% offset yield strength" as defined in ASTM D638-14. ASTM D638-14 section A2.6 defines the test method for "offset yield strength" and is defined as the stress at which the strain exceeds by a specified amount (the offset) an extension of the initial proportional portion of the stress-strain curve. It is expressed in force per unit area, usually megapascals (pounds force per square inch).

The substrate layer may be formed of any useful polymeric material that provides the desired mechanical properties (such as dimensional stability) and optical properties (such as light transmission and clarity) to the display film. Examples of materials suitable for use in the polymeric substrate layer include polymethylmethacrylate, polycarbonate, polyamides, polyimide, polyesters (PET, PEN), polycyclic olefin polymers, and thermoplastic polyurethanes. One useful polymeric material for forming the transparent polymeric substrate layer is polyimide. In many embodiments the polyimide substrate layer is colorless. Colorless polyimide can be formed via chemistry or via nanoparticle incorporation. Some exemplary colorless polyimides formed via chemistry are described in WO 2014/092422.

The substrate layer may be primed or treated to impart some desired property to one or more of its surfaces. In particular the substrate layer can be primed to improve adhesion of the energy dissipation layer or glass layer or an optically clear adhesive layer with the substrate layer. Examples of such treatments include corona, flame, plasma and chemical treatments such as, acrylate or silane treatments.

The hardcoat layer (disposed on the substrate) has a thickness of less than 50 micrometers or less than 40 micrometers. The hardcoat layer has a thickness in a range from 2 to 30 micrometers, or from 2 to 15 micrometers, or from 3 to 10 micrometers. The hardcoat layer includes nanoparticles.

Suitable hardcoats can include a variety of cured polymeric materials having inorganic nanoparticles. These hardcoats can include but are not limited to (meth)acrylic based hardcoats, siloxane hardcoats, polyurethane hardcoats and the like.

One preferable class of hardcoats includes acrylic hardcoats comprising inorganic nanoparticles. Such hardcoats can have a polymerizable resin composition comprising mixtures of multifunctional (meth)acrylic monomers, oligomers, and polymers, where the individual resins can be monofunctional, difunctional, trifunctional, tetrafunctional or have even higher functionality. In preferred cases, the polymerizable (meth)acrylate components of the resin system are chosen such that when polymerized the hardcoat contains little to no free (meth)acrylic monomers.

Useful multifunctional (meth)acrylate monomers and oligomers include:

(a) di(meth)acryl containing monomers such as 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, tripropylene glycol diacrylate;

(b) tri(meth)acryl containing monomers such as glycerol triacrylate, trimethylolpropane triacrylate, ethoxylated triacrylates (e.g., ethoxylated trimethylolpropane triacrylate), propoxylated triacrylates (e.g., propoxylated glyceryl triacrylate, propoxylated trimethylolpropane triacrylate), trimethylolpropane triacrylate, tris(2-hydroxyethyl)isocyanurate triacrylate;

(c) higher functionality (meth)acryl containin monomer such as ditrimethylolpropane tetraacrylate, dipentaerythritol pentaacrylate, pentaerythritol triacrylate, ethoxylated pentaerythritol tetraacrylate, and caprolactone modified dipentaerythritol hexaacrylate.

Oligomeric (meth)acryl monomers such as, for example, urethane acrylates, polyester acrylates, and epoxy acrylates can also be employed.

Such (meth)acrylate monomers are widely available from vendors such as, for example, Sartomer Company of Exton, Pa.; Cytec Industries of Woodland Park, N; and Aldrich Chemical Company of Milwaukee, Wis.

The hardcoat composition may include surface modified inorganic oxide particles that add mechanical strength and durability to the resultant coating. The particles are typically substantially spherical in shape and relatively uniform in size. The particles can have a substantially monodisperse size distribution or a polymodal distribution obtained by blending two or more substantially monodisperse distributions. The inorganic oxide particles are typically non-aggregated (substantially discrete), as aggregation can result in precipitation of the inorganic oxide particles or gelation of the hardcoat.

The size of inorganic oxide particles is chosen to avoid significant visible light scattering.

The hardcoat composition may comprises a significant amount of surface modified inorganic oxide nanoparticles having an average (e.g. unassociated) primary particle size or associated particle size of at least 10, 20, 30, 40 or 50 nm and no greater than about 200, 175 or 150 nm. When the hardcoat composition lacks a significant amount of inorganic nanoparticles of such size, the cured hardcoat can crack when subjected to the pencil hardness test. The total concentration of inorganic oxide nanoparticles is typically a least 30, 35, or 40 wt-% solids and generally no greater than 90 wt-%, 80 wt-%, or 75 wt-% and in some embodiments no greater than 70 wt-%, or 65 wt-%, or 60 wt-% solids.

The hardcoat composition may comprise up to about 10 wt-% solids of smaller nanoparticles. Such inorganic oxide nanoparticles typically having an average (e.g. unassociated) primary particle size or associated particle size of at least 1 nm or 5 nm and no greater than 50, 40, or 30 nm.

Aqueous colloidal silicas dispersions are commercially available from Nalco Chemical Co., Naperville, Ill. under the trade designation "Nalco Collodial Silicas" such as products 1040, 1042, 1050, 1060, 2327, 2329, and 2329K or Nissan Chemical America Corporation, Houston, Tex. under the trade name Snowtex™. Organic dispersions of colloidal silicas are commercially available from Nissan Chemical under the trade name Organosilicasol™. Suitable fumed silicas include for example, products commercially available from Evonki DeGussa Corp., (Parsippany, N.J.) under the trade designation, "Aerosil series OX-50", as well as product numbers -130, -150, and -200. Fumed silicas are also commercially available from Cabot Corp., Tuscola, Ill., under the trade designations CAB-O-SPERSE 2095", "CAB-O-SPERSE A105", and "CAB-O-SIL M5".

It may be desirable to employ a mixture of inorganic oxide particle types to optimize an optical property, material property, or to lower that total composition cost.

As an alternative to or in combination with silica the hardcoat may comprise various high refractive index inorganic nanoparticles. Such nanoparticles have a refractive index of at least 1.60, 1.65, 1.70, 1.75, 1.80, 1.85, 1.90, 1.95, 2.00 or higher. High refractive index inorganic nanoparticles include for example zirconia ("$ZrO_2$"), titania ("$TiO_2$"), antimony oxides, alumina, tin oxides, alone or in combination. Mixed metal oxide may also be employed.

Zirconias for use in the hardcoat layer are available from Nalco Chemical Co. under the trade designation "Nalco OOSS008", Buhler AG Uzwil, Switzerland under the trade designation "Buhler zirconia Z-WO sol" and Nissan Chemical America Corporation under the trade name NanoUse ZR™. Zirconia nanoparticles can also be prepared such as described in U.S. Patent Publication No. 2006/0148950 and U.S. Pat. No. 6,376,590. A nanoparticle dispersion that comprises a mixture of tin oxide and zirconia covered by antimony oxide (RI-1.9) is commercially available from Nissan Chemical America Corporation under the trade designation "HX-05M5". A tin oxide nanoparticle dispersion (RI 2.0) is commercially available from Nissan Chemicals Corp. under the trade designation "CX-S401M". Zirconia nanoparticles can also be prepared such as described in U.S. Pat. Nos. 7,241,437 and 6,376,590.

The protective layer may be an elastic nanocomposite layer. The elastic nanocomposite layer may be a nanoparticle nanocomposite ionic elastomeric layer, or an elastic nanocomposite urethane layer. The nanoparticle nanocomposite ionic elastomeric layer, or the elastic nanocomposite urethane layer may be directly coated onto the glass layer or optically clear adhesive layer. Alternatively, the nanoparticle nanocomposite ionic elastomeric layer, or the elastic nanocomposite urethane layer may be coated onto a transparent substrate layer, as described above, and the transparent substrate layer is directly attached to the glass layer or optically clear adhesive layer.

Figure 7:
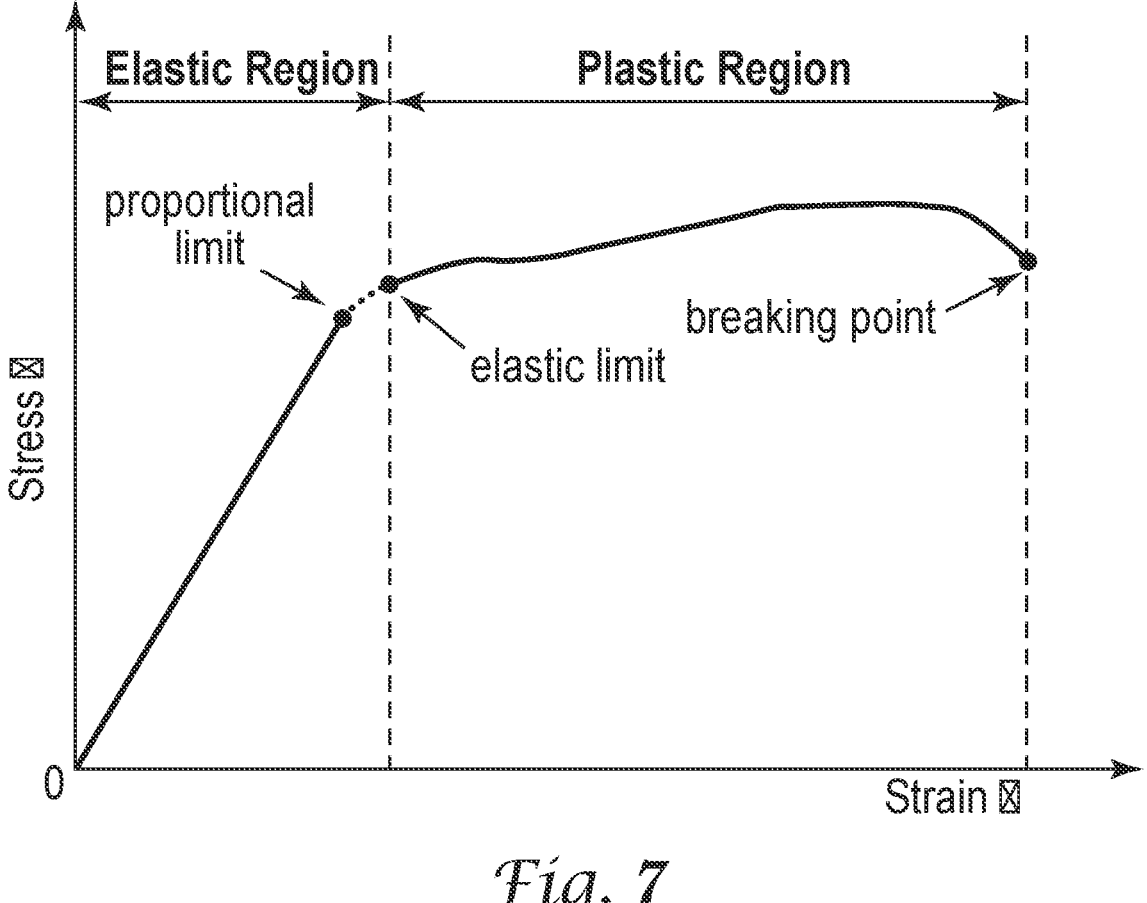
FIG. 7 is a stress-strain graph illustrating the elastic and plastic regions, proportional and elastic limits, and the breaking point for a material.

The transparent protective layer may be an elastic nanocomposite layer. This layer may have a thickness in a range from 30 to 125 micrometers. This elastic nanocomposite material can be made from any useful material that provides durable surface properties to the outer layer. In some cases, this elastic nanocomposite layer is made from polyurethane nanocomposite materials such as silica nanoparticle filled UV curable polyurethane resins. In other embodiments the elastic nanocomposite material can be made from nanoparticle filled ionic elastomer materials. This elastic nanocomposite layer is capable of stretching within an elastic range, so that permanent deformation does not occur. The proportional limit for a material is defined as the maximum stress at which the stress is proportional to strain (Hooke's law). The elastic limit is the minimum stress at which permanent deformation can be measured. The elastic nanocomposite layer may have a strain at the elastic limit that is 20% greater than the strain at the proportional limit, 50% greater than the strain at the proportional limit, or 100% greater than the strain at the proportional limit. FIG. 7 illustrates this concept.

An intermediate adhesive layer 11 may fix the energy dissipation layer 14 to the glass layer 12. The intermediate adhesive layer mechanically and optically couples the glass layer to the energy dissipation layer.

The intermediate adhesive layer may have a thickness in a range from 1 to 100 micrometers, or from 5 to 50 micrometers, or 10 to 50 micrometers.

The intermediate adhesive layer may have a shear modulus of at least 40 MPa or at least 10 MPa or at least 1 MPa or at least 200 kPa.

The intermediate adhesive layer may be formed of one or more of acrylate, silicone, polyolefin, polyester, polyurethane, epoxy or polyisobutylene, silicone polyoxamide, or silicone polyurea. In some cases the intermediate adhesive may be a pressure sensitive adhesive. In some cases a pressure sensitive adhesive may be cured in place to increase the modulus. In other cases the adhesive may be a heat activated adhesive. Heat activated adhesives are non-tacky at room temperature, can be applied as a film, but become tacky and capable of bonding to a substrate at elevated temperatures. These adhesives usually have a $T_g$ (glass transition temperature) or melting point ($T_m$) above room temperature. When the temperature is elevated above the $T_g$ or $T_m$, the storage modulus usually decreases and the adhesive becomes tacky. For very high modulus (for example >10 MPa), the adhesive may be structural adhesive such as those described in US2007/0092733.

An optically clear adhesive layer 13 may fix the glass layer 12 to the protective layer 15. The optically clear adhesive layer may allow the hardcoat layer to be cleanly removable from the glass layer.

The optically clear adhesive layer may have a thickness in a range from 1 to 50 micrometers, or from 3 to 25 micrometers, or from 3 to 15 micrometers.

The optically clear adhesive layer may be formed of acrylate, silicone, silicone polyoxamide, silicone polyurea, polyolefin, polyester, polyurethane or polyisobutylene.

FIG. 5 is a schematic diagram side elevation view of an illustrative display film 10 on an optical display 26 forming an article 50. The display film 10 (see FIG. 1 description above) may be any of the display film constructions described herein. A coupling layer 24 fixes the display film 10 to the optical display 26. The coupling layer 24 may be disposed on any of the display film constructions described herein.

A coupling layer 24 adheres the display film 10 to the optical element 26. The coupling layer 24 may be a pressure sensitive adhesive. In some cases the coupling layer 24 permanently fixes the display film 10 to the optical element 26. In other cases the display film and coupling layer 24 can be removed/debonded/repositioned, relative to the optical element 26, with the application of heat or mechanical force such that the display film is replaceable or repositionable by the consumer.

The coupling layer may be comprised of acrylate, silicone, silicone polyoxamide, silicone polyurea, polyolefin, polyester, polyurethane or polyisobutylene or mixtures thereof as long as the coupling layer has suitable optical properties in terms of low haze, high transmission and low yellow index. In some cases the coupling layer may be an optically clear adhesive or pressure sensitive adhesives The coupling layer 24 may have a shear modulus (G') of 300 kPa or less, or 200 kPa or less, or 100 kPa or less or 50 kPa or less over a temperature range for example –40° C. to 70° C., or from –40° C. to 50° C., or from –30° C. to 50° C., or from –20° C. to 50° C. The rheological properties of the material can be measured using a parallel plate rheometer to probe the shear modulus as a function of temperature as well as to determine the glass transition temperature (Tg) of the material. This test can be done by using an 8 mm diameter by about 1 mm thick disk of the coupling layer material and placing it between the probes of a DHR parallel plate rheometer (TA Instruments, New Castle, Del.). A temperature scan can be performed, for example, by ramping from –45° C. to 50° C. at 3° C./min. During this ramp, the sample is oscillated at a frequency of 1 Hz and a strain of approximately 0.4%. The shear moduli (G' and G") are recorded at selected key temperatures. The Tg of the material can be determined as the peak in the tan delta vs. temperature profile. To ensure sufficient compliance of the coupling material over the typical range of use temperatures, it is preferred to have the shear storage modulus (G') below about 2 MPa over the entire temperature range from about –20° C. to about 40° C. when measured using the test described above A release liner or premask layer (not shown) may be disposed on the coupling layer 24. The release liner may be easily removed for application to an optical display or to reveal the display film, before placement onto an optical display 26. The removable or release liner (or premask layer) may provide transport protection to the underlying display film and optional coupling layer 24. The removable liner may be layer or film that has a low surface energy to allow clean removal of the liner from the display film 10 and optional coupling layer 24. The removable liner may be a layer of polyester coated with a silicone, for example.

The removable liner may provide temporary structure to the optional coupling layer 24. For example, WO2014/197194 and WO2014/197368 describe removable liners that emboss an coupling layer where the coupling layer loses its structures slowly once the removable liner is stripped away from the optical adhesive layer. This allows for ease of application where the temporary structure can allow for air bleed in lamination which then disappears in the laminated construction.

FIG. 6 is a schematic diagram perspective view of an illustrative folding article 60 including an illustrative display film 10. The display film 10 may be any of the display film constructions described herein disposed on an optical element such as an optical display 34. The display device may not be a folding article and may only flex within a certain range, or may be a static curved display device.

An optical display 34 may form at least a portion of display device. The display device 60 may include a display window 32. The display device 60 can be any useful article such as a phone or smartphone, electronic tablet, electronic notebook, computer, and the like. The optical display may include an organic light emitting diode (OLED) display panel. The optical display may include a liquid crystal display (LCD) panel or a reflective display. Examples of reflective displays include electrophoretic displays, electro-fluidic displays (such as an electrowetting display), interferometric displays or electronic paper display panels, and are described in US 2015/0330597.

The display film 10 and the optical display 34 may be foldable so that the optical display 34 faces itself and at least a portion of display film 10 contacts or directly faces another portion of the protective film 10, as illustrated in FIG. 6. The display film 10 and the optical display 34 may be flexible or bendable or foldable so that a portion of the display film 10 and the optical display 34 can articulate relative to another portion of the display film 10 and the optical display 34. The display film 10 and the optical display 34 may be flexible or bendable or foldable so that a portion of the display film 10 and the optical display 34 can articulate at least 90 degrees or at least 170 degrees relative to another portion of the display film 10 and the optical display 34.

The display film 10 and the optical display 34 may be flexible or bendable or foldable so that a portion of the display film 10 and the optical display 34 can articulate relative to another portion of the display film 10 and optical display 34 to form a bend radius of 3 mm or less in the display film 10 at the bend or fold line. The display film 10 and the optical display 34 may be flexible or bendable or foldable so that a portion of the display film 10 and optical display 34 can articulate relative to another portion of the display film 10 and the optical display 34 to form a bend radius such that the display film 10 overlaps itself and is separated from each other by a distance on 10 mm or less, or 6 mm or less or 3 mm or less or contacts each other.

The display films described herein may have a haze value of 2% or less, or 1.5% or less, or 1% or less, or 0.5% or less. In some embodiments the display film may have a haze value of 5% or less. The display film may have a clarity of 98% or greater, or 99% or greater. The display film may have a visible light transmission of 85% or greater, or 90% or greater, or 93% or greater.

The display film may have a yellow index or b* value of 5 or less, or 4 or less, or 3 or less, or 2 or less, or 1 or less. In many embodiments the display film may have a yellow index or b* value of 1 or less.

Objects and advantages of this disclosure are further illustrated by the following examples, but the particular materials and amounts thereof recited in these examples, as well as other conditions and details, should not be construed to unduly limit this disclosure.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

TABLE 1

| Materials | |
|---|---|
| Abbreviation or Trade Designation | Description |
| K-FLEX 188 "Polyol 1" | Aliphatic polyester polyol, commercially available from King Industries, Norwalk, CT under the trade name "K-FLEX 188" |
| Fomrez 55-112 "Polyol 2" | Hydroxyl terminated saturated linear polyester available from Chemtura, Middlebury, CT under the trade name "Fomrez 55-112" |
| DESMODUR N3300A | Aliphatic polyisocyanate, commercially available from Bayer, Pittsburgh, PA under the trade name "DESMODUR N3300A". |
| DESMODUR N3400 | Aliphatic polyisocyanate, commercially available from Bayer, Pittsburgh, PA under the trade name "DESMODUR N3400". |

TABLE 1-continued

Materials

| Abbreviation or Trade Designation | Description |
|---|---|
| DABCO T-12 | Dibutyltin dilaurate catalyst, commercially available from Air Products and Chemicals, Inc., Allentown, PA, under the trade name "DABCOT-12". |
| CN9004 | Aliphatic polyurethane acrylate oligomer, commercially available from Sartomer Arkema Group, Exton, PA. |
| CN3211 | Aliphatic polyester polyurethane acrylate oligomer, commercially available from Sartomer Arkema Group, Exton, PA. |
| CD9043 | Alkoxylated neopentyl glycol diacrylate, commercially available from Sartomer Arkema Group, Exton, PA. |
| SR501 | Propoxylated trimethylolpropane triacrylate, commercially available from Sartomer Arkema Group, Exton, PA. |
| SR531 | Cyclic trimethylol formal acrylate, commercially available from the Sartomer Arkema Group, Exton, PA. |
| SR415 | Ethoxylated trimethylolpropane triacrylate, commercially available from the Sartomer Arkema Group, Exton, PA. |
| Irgacure TPO-L | Liquid photinitiator, BASF |
| Irgacure 184 | Photoinitiator, BASF |

Polyurethane Examples 1-5

Samples of shape memory polyurethane were prepared in a roll to roll process where the isocyanate and polyol with catalyst were mixed using an inline dynamic mixer. The solutions were applied to a moving web between two silicone release liners at an appropriate flow rate to achieve the desired final sample thickness. The polyurethane between films were heated at 70° C. and wound into a roll. The films were postbaked at 70° C. for 24 hours prior to lamination to glass. Samples had a range of equivalents of NCO reacted with 1.0 equivalents of —OH, as shown in Table 2 in order to achieve the desired glass transition temperature and crosslink concentration. Relative proportions by mass of K-FLEX 188 and Desmodur N3300 for samples 1-5 are shown in Table 2. The coated materials contained about 350 ppm dibutyltin dilaurate catalyst.

TABLE 2

Coating compositions and theoretical crosslink concentration

| Example | Polyol with catalyst (g) | DESMODUR 3300 (g) | NCO/OH Ratio | Theoretical Gel Content | Theoretical Crosslink Concentration (mol/kg) |
|---|---|---|---|---|---|
| 1 | 32.8 | 20.74 | 0.8 | 96.67% | 0.34 |
| 2 | 32.8 | 22.03 | 0.85 | 98.31% | 0.42 |
| 3 | 32.8 | 23.33 | 0.9 | 99.32% | 0.49 |
| 4 | 32.8 | 24.62 | 0.95 | 99.85% | 0.57 |
| 5 | 32.8 | 25.92 | 1 | 100% | 0.65 |

Polyurethane Examples 6-9

Similar to samples 1-5, but these polyurethane coatings were made with a mixture of isocyanates. The polyurethanes, for these examples, was composed of an aliphatic polyol (K-FLEX 188) reacted with a blend of multifunctional isocyanates (Desmodur N3300 and Desmodur N3400), prepared in the same manner as samples 1-5. The weight ratio K-FLEX to Desmodur N3300 to Desmodur N3400 for samples 6-9 are shown in Table 3.

TABLE 3

Mix ratios for polyurethanes for Examples 6-9

| Example | K188 | N3300 | N3400 | NCO/OH Ratio | (NCO + UD)/OH Ratio[1] | Theoretical Gel Content | Theoretical Crosslink Concentration |
|---|---|---|---|---|---|---|---|
| 6 | 62.8 | 0 | 37.2 | 0.75 | 1.03 | 100% | 0.74 |
| 7 | 62.4 | 18.8 | 18.8 | 0.76 | 0.91 | 99.3% | 0.55 |
| 8 | 65.2 | 17.4 | 17.4 | 0.67 | 0.80 | 96.5% | 0.37 |
| 9 | 62.5 | 25.0 | 12.5 | 0.76 | 0.85 | 98.3% | 0.45 |

[1]Note that the N3400 isocyanate contains a uretdione unit that can react with excess OH in the polyol component at elevated temperature to form an allophanate group. For this reason, the table contains two stoichiometric ratio columns. The first calculates the NCO/OH ratio based on only existing NCO content in N3300 and N3400 at the beginning of the reaction. The NCO + UD/OH ratio accounts for the ratio after the uretdione is reacted with excess OH of the polyol.

Polyurethane Example 10

Similar to samples 1-5, but this polyurethane coating was made with an alternative polyol, Fomrez 55-112 in order to achieve an even lower glass transition temperature. The polyurethane was composed of an aliphatic polyol (Fomrez 55-112) reacted with a multifunctional isocyanate (Desmodur N3300), prepared in the same manner as samples 1-5. The weight ratio Fomrez 55-112 to Desmodur N3300 for sample 10 is shown in Table 4. Ovens were run at 70° C. and the samples were post-cured for 24 hours at 70° C.

TABLE 4

Coating composition and theoretical crosslink concentration

| Example | Fomrez 55-112 with catalyst (g) | DESMODUR 3300 (g) | NCO/OH Ratio | Theoretical Gel Content | Theoretical Crosslink Concentration (mol/kg) |
|---|---|---|---|---|---|
| 10 | 72.0 | 28.05 | 1.00 | 100.0% | 0.41 |

Polyurethane Layer Characterization

Glass Transition Temperature

The glass transition temperature of the polyurethane coatings was characterized using Q800 DMA from TA Instruments. Samples were cut into strips 6.35 mm wide and about 4 cm long. The thickness of each film was measured. The films were mounted in the tensile grips of a Q800 DMA from TA Instruments with an initial grip separation between 16 mm and 19 mm. The samples were then tested at an oscillation of 0.2% strain and 1 Hz throughout a temperature ramp from −50° C. to 200° C. at a rate of 2° C. per minute. The results are shown in Table 5. The onset of the glass transition was determined by location of peak for E". The temperature at which the Tan Delta signal reached a maximum was recorded as the peak Tan Delta temperature.

TABLE 5

Thermal and mechanical properties of the coatings alone

| | Dynamic Mechanical Analysis | | | |
|---|---|---|---|---|
| Example | Tg by E" (° C.) | Storage Modulus @ °0 C. (GPa) | Peak Tan Delta | Temp at peak Tan Delta (° C.) |
| 1 | 25.2 | 1.47 | 1.79 | 39.4 |
| 2 | 30.9 | 1.47 | 1.66 | 43.9 |
| 3 | 37.5 | 1.4 | 1.68 | 47.5 |
| 4 | 40.8 | 1.43 | 1.61 | 49.8 |
| 5 | 38.6 | 1.54 | 1.46 | 47.5 |
| 6 | 9.32 | 1.36 | 1.76 | 16.1 |
| 7 | 13.5 | 1.62 | 1.76 | 25.6 |
| 8 | 8.7 | 1.54 | 1.87 | 20.5 |
| 9 | 6.2 | 1.75 | 1.48 | 18.5 |
| 10 | −25 | 0.003 | 1.32 | −11 |

Example 11: Polyurethane Acrylate Resin and Film

Into a Flacktek Inc. size 20 speedmixer cup was added 99.5 g of CN9004 and 0.5 g of Irgacure TPO-L catalyst. The contents were mixed using a Flacktek DAC 150 FVZ-K speedmixer and were mixed at 3100 rpm for 1 min. The resulting solution was homogeneous near colorless viscous solution. The resulting solution was then placed into a vacuum oven at 40 Celsius and was degassed to remove all dissolved air and bubbles from the viscous solution. The solution had a viscosity of ~50000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 12: Polyurethane Acrylate Resin and Film

Into a Flacktek Inc. size 20 speedmixer cup was added 99.5 g of CN3211 and 0.5 g of Irgacure TPO-L catalyst. The contents were mixed using a Flacktek DAC 150 FVZ-K speedmixer and were mixed at 3100 rpm for 1 min. The resulting solution was homogeneous near colorless viscous solution. The resulting solution was then placed into a vacuum oven at 40 Celsius and was degassed to remove all dissolved air and bubbles from the viscous solution. The solution had a viscosity of ~25000 cP at room temperature.

Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 13: Polyurethane Acrylate Resin (90/10) and Film

Into a Flacktek Inc. size 20 speedmixer cup was added 79.60 g of CN3211 (Sartomer, Inc.) and 19.90 g of SR501 (Sartomer, Inc.). The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~8500 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 14: Polyurethane Acrylate Resin (80/20) and Film

Into a Flacktek Inc. size 20 speedmixer cup was added 79.60 g of CN3211 and 19.90 g of CD9043. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~5800 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 15: Polyurethane Acrylate Resin (80/20) and Film

Into a Flacktek Inc. size 20 speedmixer cup was added 79.60 g of CN3211 and 19.90 g of SR415. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~5500 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 16: Polyurethane Acrylate Resin (70/30) and Film

Into a Flacktek Inc. size 20 speedmixer cup was added 69.65 g of CN3211 and 29.85 g of SR531. The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~4000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 17: Polyurethane Acrylate Resin (80/20) and Film

Into a Flacktek Inc. size 20 speedmixer cup was added 79.60 g of CN3211 and 19.90 g of SR531. The contents were were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

Example 18: Polyurethane Acrylate Resin (90/10) and Film

Into a Flacktek Inc. size 20 speedmixer cup was added 89.55 g of CN3211 (Sartomer, Inc.) and 9.95 g of SR531 (Sartomer, Inc.). The contents were mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~6000 cP at room temperature. Film samples were made from this resin by coating the resin between a 2 mil thick ZF-50 and a 2 mil thick T50 silicone release coated polyester liner. The solution between films was drawn under a notch bar such a 175 um film was cast. The coating between liners was irradiated under low power 350 nm black light bulbs for 15 minutes to give a cured film with elastic properties.

TABLE 6

Properties of crosslinked polyurethane core layer materials

| Example | Oligomer/ Diluent | Oligomer to Diluent Ratio | Tg (° C.) (Peak Tan δ) | Tan δ | Tg by E" (° C.) (from DMA Storage Modulus) | Storage Modulus (MPa) (23° C./−20° C.) |
|---|---|---|---|---|---|---|
| 11 | CN9004/ NA | 100/0 | −67 | 0.614 | −73.6 | 7.42/9.86 |
| 12 | CN3211/ NA | 100/0 | −20.7 | 1.473 | −29.7 | 2.87/27.4 |
| 13 | CN3211/ SR501 | 80/20 | −5.24 | 0.639 | −25.1 | 7.74/515.9 |
| 14 | CN3211/ CD9043 | 80/20 | −24.1 | 1.390 | −32.3 | 3.59/15.99 |
| 15 | CN3211/ SR415 | 80/20 | −21.5 | 1.334 | −28.8 | 5.09/31.22 |
| 16 | CN3211 / SR531 | 70/30 | −5.5 | 1.334 | −22.9 | 1.80/711.9 |
| 17 | CN3211/ SR531 | 80/20 | −11.0 | 1.359 | −24.9 | 2.23/360.1 |
| 18 | CN3211/ SR531 | 90/10 | −16.7 | 1.398 | −27.3 | 2.39/97.4 | mixed using a Flacktek DAC 150 FVZ-K speedmixer and were mixed at 3100 rpm for 1 min. The resulting solution was homogeneous near colorless viscous solution. To the speedmixer cup was added 0.5 g of Irgacure TPO-L catalyst. The contents were again mixed at 31000 rpm for 1 min. The resulting solution was then placed into a vacuum oven at 40 Celsius and was degassed to remove all dissolved air and bubbles from the viscous solution. The solution had a viscosity of ~5000 cP at room temperature. Film samples

Dynamic Mechanical Analysis Test Method

Samples were cut into strips 6.35 mm wide and about 4 cm long. The thickness of each film was measured. The films were mounted in the tensile grips of a Q800 DMA from TA Instruments with an initial grip separation between 16 mm and 19 mm. The samples were then tested at an oscillation of 0.2% strain and 1 Hz throughout a temperature ramp from −20° C. to 200° C. at a rate of 2° C. per minute. The temperature at which the Tan Delta signal reached a maximum was recorded as the peak Tan Delta temperature. Glass transition temperatures were taken from peak of E".

Glass/Polyurethane Constructions

Example A

A 3 inch by 6 inch sample of glass was cut using a diamond scribe from a roll of NEG glass (material OA-10G, 300 mm wide, 30 m length, 100 micron thickness). A film sample of shape memory polyurethane was prepared by coating between two silicone release liners. The polyurethane film was made by mixing a polyol containing ~500 ppm of a tin catalyst and an isocyanate. The Polyol with catalyst (K-FLEX 188) and isocyanate (DESMODUR N3300) were added to separate pump carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rate for the Polyol with catalyst and DESMODUR N3300 were to 32.8 g/min and 20.74 g/min respectively to give an overall target NCO/OH ratio for the polyurethane reactive mixture of 0.8. The 2-part polyurethane reactive mixture was coated between two silicone release liners (for example for example T50 release liner available from Eastman Chemical). The reactive mixture was coated to a desired thickness between the release films in a continuous fashion using a notch bar coating method where thickness was controlled by setting a defined gap. The coated polyurethane film was heated at elevated temperature on hot platens to gel the polyurethane film and resulting film was placed into a 70° C. oven for 16 hours to cure. The resulting film with liners was ~260 um. The polyurethane film was ~156 um.

The glass/polyurethane construction was made by peeling the liner from one side of the polyurethane film and laminating it to the glass. This laminated structure was heated at 70° C. for approximately 24 hours. The second liner was removed and the glass/polyurethane construction was subjected to ball drop and impact testing and results are described in Table 7.

Example B

A 3 inch by 6 inch sample of glass was cut using a diamond scribe from a roll of NEG glass (material OA-10G, 300 mm wide, 30 m length, 100 micron thickness). A film sample of shape memory polyurethane was prepared by coating between two silicone release liners. The polyurethane film was made by mixing a polyol containing ~500 ppm of a tin catalyst and an isocyanate. The Polyol with catalyst (K-FLEX 188) and isocyanate mixture (DESMODUR N3300 and Desmodur 3400) were added to separate pump carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rates for the Polyol with catalyst and DESMODUR N3300 and Desmodur 3400 were set to 65.2 g/min, 17.4 g/min and 17.4 g/min respectively to give an overall target NCO/OH ratio for the polyurethane reactive mixture of 0.67. The 2-part polyurethane reactive mixture was coated between two silicone release liners (for example T50 release liner available from Eastman Chemical). The reactive mixture was coated to a desired thickness between the release films in a continuous fashion using a notch bar coating method where thickness was controlled by setting a defined gap. The coated polyurethane film was heated at elevated temperature (~160° F.) on hot platens to gel the polyurethane film and resulting film was placed into a 70° C. oven for 16 hours to cure. The resulting film with liners was ~240 um. The polyurethane film was ~136 um.

The glass/polyurethane construction was made by peeling the liner from one side of the polyurethane film and laminating it to the glass. This laminated structure was heated at 70° C. for approximately 24 hours. The second liner was removed and the glass/polyurethane construction was subjected to ball drop and impact testing and results are described in Table 7.

Example C

A 3 inch by 6 inch sample of glass was cut via diamond scribe from a roll of 100 micron thick Schott glass (Type D263™ T eco). Into a Flacktek Inc. size 20 speedmixer cup was added 14 g of K-FLEX 188 containing ~500 ppm of DABCO T-12 and ~10.0 g of Desmodur N-3300A. The contents were mixed using a Flacktek DAC 150 FVZ-K speedmixer and were mixed at 1500 rpm for 30 seconds. The resulting viscous mixture was homogeneous and near colorless. The viscous mixture was applied to the surface of the glass by placing the glass sample between two silicone release liners and coating the polyurethane over the glass sample by pulling two release liners with polyurethane under a notch bar having a defined gap to produce a 100 um thick coating of polyurethane on 100 um thick glass. The sample between liners was cured at 70° C. for 24 hours. The two release liners were removed to give the glass and polyurethane construction. The construction was subjected to ball drop and impact testing and results are described in Table 7.

Example D

A was polyurethane glass construction was prepared as described above in Example C and a 2 mil layer of PET (available from DuPont) was laminated to the polyurethane using a 2 mil optically clear film adhesive (8146 OCA available from 3M). The construction was subjected to ball drop and impact testing and results are described in Table 7.

Comparative Example 1

A 4 mil layer of an optically clear adhesive (3M 8146 OCA) was laminated to a 100 micron thick NEG glass layer as described in Example A. A 2 mil PET film (Available from DuPont) was laminated to the other side of the adhesive. The glass/OCA construction with 2 mils of OCA between the glass and PET layers was subjected to ball drop and impact testing and results are described in Table 7.

Comparative Example 2

To a 100 um sample of Schott glass as described in example C was laminated in succession three layers of 2 mil of 3M 8146 OCA followed by a layer of 2 mil of PET (available from DuPont). The resulting glass/OCA construction with 6 mils of OCA between the glass and PET layers was subjected to ball drop and impact testing and results are described in Table 7.

25

TABLE 7

| | Impact test results | |
| Example | 4.3 g Ball Drop (cm) | Pen Drop (cm) |
| --- | --- | --- |
| A | 27 | >16 |
| B | 27 | >16 |
| C | 27 | >16 |
| D | 27 | 16 |
| C1 | 4 | 10 |
| C2 | 7 | 6 |

The impact resistance of the protective display film was tested two ways: first by dropping a 4.3 g stainless steel ball on to each construction and then by dropping a Bic™ stick pen (1 mm ball tip) with cap attached to the non-writing end (total weight 5.5 g), from the specified height. The drop height was measured from the bottom of the ball or writing tip of the pen to the surface of the sample. The ball and pen were both dropped down a narrow tube that ensured that the pen hit the sample at approximately 90 degree angle with respect to the surface. A new area of the sample free of pre-existing cracks was used for each drop test. The maximum drop height that could be tested with the apparatus was 27 cm for the ball and 16 cm for the pen. The critical height was recorded as the maximum height the ball or pen could be dropped from without a permanent mark or the glass cracking.

Thus, embodiments of PROTECTIVE DISPLAY FILM WITH GLASS are disclosed. Although reference is made to the accompanying set of drawings that form a part hereof and in which are shown by way of illustration several specific embodiments, it is to be understood that other embodiments are contemplated and may be made without departing from (e.g., still falling within) the scope or spirit of the present disclosure. The detailed description, therefore, is not to be taken in a limiting sense.

All references and publications cited herein are expressly incorporated herein by reference in their entirety into this disclosure, except to the extent they may directly contradict this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

Unless otherwise noted, all parts, percentages, ratios, etc. are by weight. These abbreviations are used herein: wt=weight, ° C.=degrees Celsius, and ppm=parts per million

The terms "fixed" of "coupled" or "connected" refer to elements being attached to each other either directly (in direct contact with each other) or indirectly (having one or more elements between and attaching the two elements).

Terms related to orientation, such as "top", "bottom", "side", and "end", are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

The phrases "at least one of," "comprises at least one of," and "one or more of" followed by a list refers to any one of the items in the list and any combination of two or more items in the list.

What is claimed is:

1. A display film comprising:
a transparent glass layer having a thickness of 250 micrometers or less; and
a transparent energy dissipation layer fixed to the transparent glass layer, the transparent energy dissipation layer comprising a cross-linked polyurethane and having a glass transition temperature 27 degrees Celsius and negative 25 degrees Celsius and a Tan Delta peak value between 0.5 and 2.0,
wherein the display film has a haze of 2.0% or less.

2. The display film according to claim 1, wherein the transparent energy dissipation layer comprises a cross-linked polyurethane acrylate layer.

3. The display film according to claim 1, wherein the transparent energy dissipation layer has a glass transition temperature 10 degrees Celsius and negative 25 degrees Celsius.

4. The display film according to claim 1, wherein the transparent energy dissipation layer has a thickness in a range from 20 to 200 micrometers.

5. The display film according to claim 1, wherein the transparent energy dissipation layer is directly fixed to the transparent glass layer.

6. The display film according to claim 1, wherein the transparent energy dissipation layer is fixed to the transparent glass layer by an intermediate adhesive layer.

7. The display film according to claim 1, further comprising a protective layer fixed to the transparent glass layer, and the transparent glass layer separates the transparent energy dissipation layer from the protective layer.

8. The display film according to claim 7, further comprising an optically clear adhesive layer separating the protective layer from the transparent glass layer.

9. The display film according to claim 1, further comprising a coupling layer disposed on the transparent energy dissipation layer, and the transparent energy dissipation layer separates the coupling layer from the transparent glass layer, the coupling layer having a shear modulus of 200 kPa or less over a temperature range from −40 degrees Celsius to 70 degrees Celsius.

10. The display film according to claim 9, further comprising a release liner contacting the coupling layer.

11. The display film according to claim 1, wherein the transparent energy dissipation layer has a Tan Delta peak value of 0.5 or greater, and the transparent energy dissipation layer has a cross-link density in a range from 0.1 to 1.0 mol/kg.

12. The display film according to claim 1, wherein the display film has a visible light transmission of 85% or greater.

13. The display film according to claim 1, wherein the display film has a thickness in a range from 30 to 300 micrometers.

14. A display film comprising:

a transparent glass layer having a thickness of 250 micrometers or less;

a transparent energy dissipation layer fixed to the transparent glass layer, the transparent energy dissipation layer comprising a cross-linked polyurethane and having glass transition temperature 27 degrees Celsius and negative 25 degrees Celsius and a Tan Delta peak value between 0.5 and 2.0; and a protective layer fixed to the transparent glass layer, the transparent glass layer separates the transparent energy dissipation layer from the protective layer, wherein the display film has a haze of 2.0% or less.

15. The display film according to claim 14, further comprising a coupling layer disposed on the transparent energy dissipation layer, the transparent energy dissipation layer separates the coupling layer from the transparent glass layer.

16. The display film according to claim 15, further comprising a release liner contacting the coupling layer.

17. A display film comprising:

a transparent glass layer having a thickness of 250 micrometers or less;

a transparent energy dissipation layer fixed to the transparent glass layer, the transparent energy dissipation layer comprising a crosslinked polyurethane and has a glass transition temperature 27 degrees Celsius and negative 25 degrees Celsius, a Tan Delta peak value between 0.5 and 2.0;

an optically clear adhesive layer disposed on the transparent glass layer; and a protective layer disposed on the optically clear adhesive layer, and the optically clear adhesive layer separates the transparent energy dissipation layer from the protective layer, wherein the display film has a haze of 2.0% or less.

18. The display film according to claim 17, further comprising a coupling layer disposed on the transparent energy dissipation layer, the transparent energy dissipation layer separates the coupling layer from the transparent glass layer.

19. The display film according to claim 18, further comprising a release liner contacting the coupling layer.

* * * * *